United States Patent
Kim et al.

(10) Patent No.: US 10,582,622 B2
(45) Date of Patent: Mar. 3, 2020

(54) ROLLABLE DISPLAY DEVICE HAVING A FLEXIBLE DISPLAY PANEL

(71) Applicant: LG Display Co., Ltd., Seoul (KR)

(72) Inventors: Min-Su Kim, Paju-si (KR); Young-Hoon Shin, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 16/005,352

(22) Filed: Jun. 11, 2018

(65) Prior Publication Data
US 2018/0359869 A1 Dec. 13, 2018

(30) Foreign Application Priority Data
Jun. 13, 2017 (KR) .......................... 10-2017-0074243

(51) Int. Cl.
| | | |
|---|---|---|
| H05K 5/00 | (2006.01) | |
| G09F 9/30 | (2006.01) | |
| H05K 5/02 | (2006.01) | |
| G09F 9/35 | (2006.01) | |
| H01L 51/00 | (2006.01) | |
| H01L 51/52 | (2006.01) | |
| G09F 9/33 | (2006.01) | |
| H01L 27/32 | (2006.01) | |

(52) U.S. Cl.
CPC .......... *H05K 5/0017* (2013.01); *G09F 9/301* (2013.01); *H05K 5/0217* (2013.01); *G09F 9/33* (2013.01); *G09F 9/35* (2013.01); *H01L 27/3244* (2013.01); *H01L 51/0097* (2013.01); *H01L 51/5237* (2013.01); *H01L 51/5253* (2013.01); *H01L 51/5259* (2013.01); *H01L 2251/5338* (2013.01)

(58) Field of Classification Search
USPC ........................................................ 361/755
See application file for complete search history.

(56) References Cited

U.S. PATENT DOCUMENTS

| | | | |
|---|---|---|---|
| 10,194,543 B2 * | 1/2019 | Seo ........................ | G06F 1/1652 |
| 2012/0242610 A1 * | 9/2012 | Yasumatsu .............. | G06F 3/045 345/173 |
| 2015/0059161 A1 * | 3/2015 | Ho .......................... | G06F 3/041 29/593 |

(Continued)

FOREIGN PATENT DOCUMENTS

| | | |
|---|---|---|
| EP | 2 947 643 A1 | 11/2015 |
| EP | 3 107 082 A1 | 12/2016 |
| WO | 2004/047059 A1 | 6/2004 |

OTHER PUBLICATIONS

Great Britain Search and Examination Report dated Dec. 21, 2018, for Great Britain Application No. 1809485.4, 5 pages.

*Primary Examiner* — Hung S. Bui
(74) *Attorney, Agent, or Firm* — Seed IP Law Group LLP

(57) ABSTRACT

A rollable display device is provided. The rollable display device may include a flexible display panel. The flexible display panel may be wound or unfolded on a panel roller according to a user's request in order to improve portability and space usability. The rollable display device may further comprise a transparent protection film disposed on a display surface of the flexible display panel. In the rollable display device, the transparent protection film may be spaced away from the flexible display panel. Thus, the rollable display device may minimize damage to the flexible display panel due to the external impact.

19 Claims, 9 Drawing Sheets

(56) References Cited

U.S. PATENT DOCUMENTS

2015/0340004 A1* 11/2015 Pang .................... G09G 5/00
                                                    345/205
2017/0358636 A1* 12/2017 Kim ................. G02F 1/133305
2018/0110137 A1   4/2018 Kim et al.

* cited by examiner

ROLLABLE DISPLAY DEVICE HAVING A FLEXIBLE DISPLAY PANEL

This application claims the priority benefit of Korean Patent Application No. 10-2017-0074243, filed on Jun. 13, 2017, which is hereby incorporated by reference as if fully set forth herein.

BACKGROUND

Technical Field

The present disclosure relates to a rollable display device comprising a flexible display panel that is wound or unfolded on a panel roller according to a user's request.

Description of the Related Art

Generally, a display device includes a display panel realizing an image. For example, the display panel may include a liquid crystal panel having a liquid crystal, and an OLED panel having a light-emitting structure.

In order to improve portability and space usability, the display device may include a flexible display panel having flexibility. For example, the display device is a rollable display device including the flexible display panel that is wound or unfolded on a panel roller according to a user's request.

The flexible display panel having flexibility may be a thin glass substrate for preventing the deterioration of the transmittance. For example, the flexible display panel may include a first flexible substrate having a display surface, and a second flexible substrate coupled with the first flexible substrate, wherein the first flexible substrate is a thin glass substrate. However, the thin glass substrate may be easily broken even by the small impacts. Thus, in the rollable display device, the brokenness of the flexible display panel due to the external impact may frequently happen.

Also, in the rollable display device, if the flexible display panel may be bent excessively as compared with when the flexible display panel is wound on the panel roller due to the external impact, the stress may be applied between the layers stacked in the bending area. Thus, in the rollable display device, the layers of the restored flexible display panel may be a shape deformed differently from before the flexible display panel being bent. Therefore, in the rollable display device, the insulation between the elements formed in the flexible display panel may be deteriorated due to the external impact.

BRIEF SUMMARY

Accordingly, the present disclosure is directed to a rollable display device.

The present disclosure provides a rollable display device capable of minimizing the damage of the flexible display device due to the external impact.

The present disclosure also provides a rollable display device capable of minimizing the bending of the flexible display device due to the external impact.

The advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

In an embodiment, there is provided a rollable display device including a flexible display panel. The flexible display panel includes a display surface and a non-display surface. A first transparent protection film is disposed on the display surface of the flexible display panel. A device body includes a panel roller and a TPS roller. An end portion of the flexible display panel is fixed to the panel roller of the device body. An end portion of the first transparent protection film is fixed to the TPS roller of the device body. Another end portion of the flexible display panel and another end portion of the first transparent protection film are fixed to a fixing structure. The first transparent protection film is spaced away from the flexible display panel.

The flexible display panel may include a first flexible substrate disposed close to the first transparent protection film, and a second flexible substrate coupled with the first flexible substrate. The first flexible substrate may be a thin glass substrate.

The fixing structure may include a coupling part and a weight part disposed under the coupling part. The coupling part of the fixing structure may fix another end portion of the flexible display panel and another end portion of the first transparent protection film.

The weight part may be heavier than the coupling part.

A supporting element may be disposed on a non-display surface of the flexible display panel opposite to the display surface.

The supporting element may be in direct contact with the flexible display panel.

An end portion of the supporting element may be fixed to the panel roller of the device body.

The first transparent protection film may include one of polyethylene terephthalate (PET), poly-methyl methacrylate (PMMA), Glassil and oleophobic.

A second transparent protection film may be disposed between the flexible display panel and the first transparent protection film. The second transparent protection film may be spaced away from the flexible display panel and the first transparent protection film.

The second transparent protection film may include a material the same as the first transparent protection film.

In another embodiment, a rollable display device includes a device body. The device body includes a panel roller and a TPS roller spaced away from the panel roller. A fixing structure is disposed on the device body. The fixing structure includes a first coupling region, a second coupling region and a separating region. The separating region is located between the first coupling region and the second coupling region. The flexible display panel includes an end portion fixing the panel roller of the device body, and another end portion fixing the first coupling region of the fixing structure. A transparent protection film includes an end portion fixing the TPS roller of the device body, and another end portion fixing the second coupling region of the fixing structure. The transparent protection film is located on a display surface of the flexible display panel.

The flexible display panel may be wound on the panel roller of the device body. The transparent protection film may be wound on the TPS roller of the device body. A direction of winding the transparent protection film may be opposite to a direction of winding the flexible display panel.

A link structure may be disposed on a non-display surface of the flexible display panel. The link structure may include an end portion fixing the device body, and another end portion fixing the fixing structure.

The flexible display panel may be located between the transparent protection film and the link structure.

A mounting bracket may surround another end portion of the flexible display panel. The mounting bracket may be coupled with the fixing structure. The mounting bracket may be coupled with another end portion of the link structure.

A back cover may be disposed on the outside of the link structure. The back cover may include an end portion coupled with another end portion of the link structure.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Figure 1:
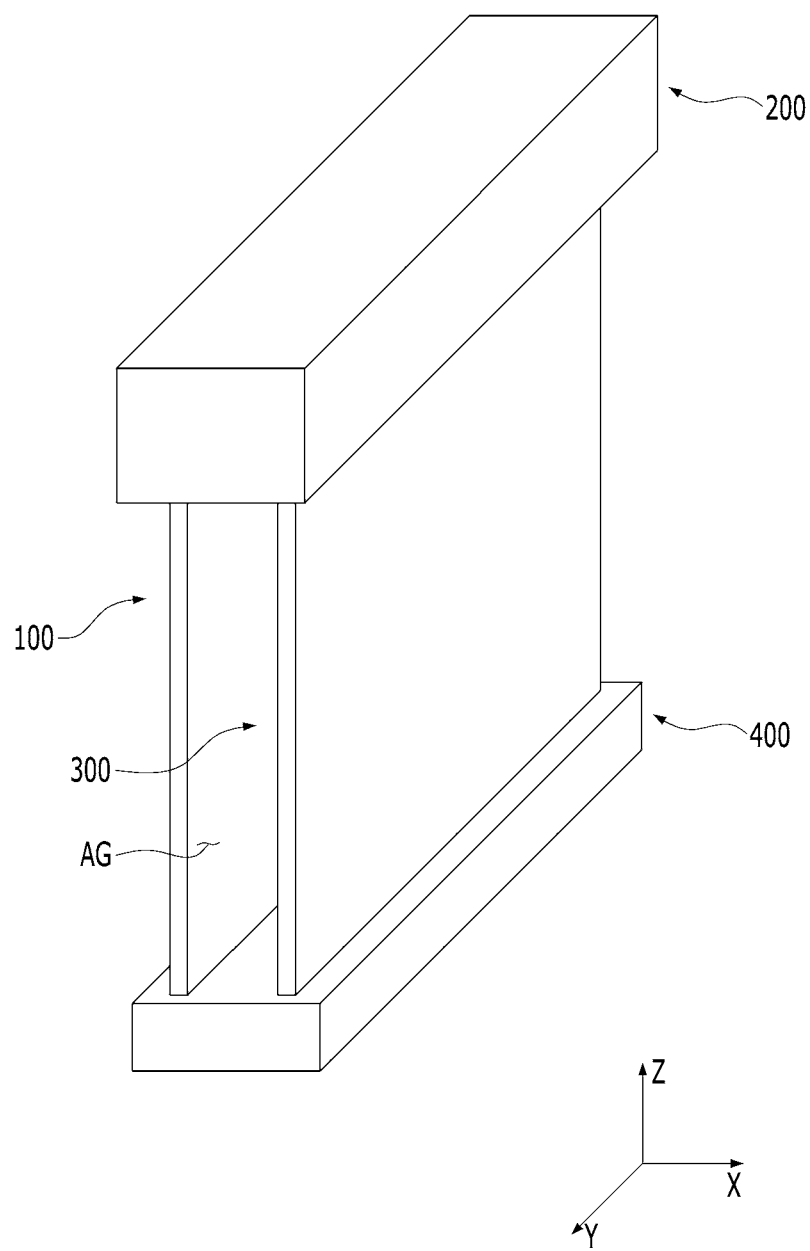
FIG. 1 is a view schematically showing a rollable display device according to an embodiment of the present disclosure.

Hereinafter, details related to the above objects, technical configurations, and operational effects of the embodiments of the present disclosure will be clearly understood by the following detailed description with reference to the drawings, which illustrate some embodiments of the present disclosure. Here, the embodiments of the present disclosure are provided in order to allow the technical sprit of the present disclosure to be satisfactorily transferred to those skilled in the art, and thus the present disclosure may be embodied in other forms and is not limited to the embodiments described below.

In addition, the same or extremely similar elements may be designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element from another element. However, the first element and the second element may be arbitrarily named according to the convenience of those skilled in the art without departing the technical sprit of the present disclosure.

The terms used in the specification of the present disclosure are merely used in order to describe particular embodiments, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Figure 2A:
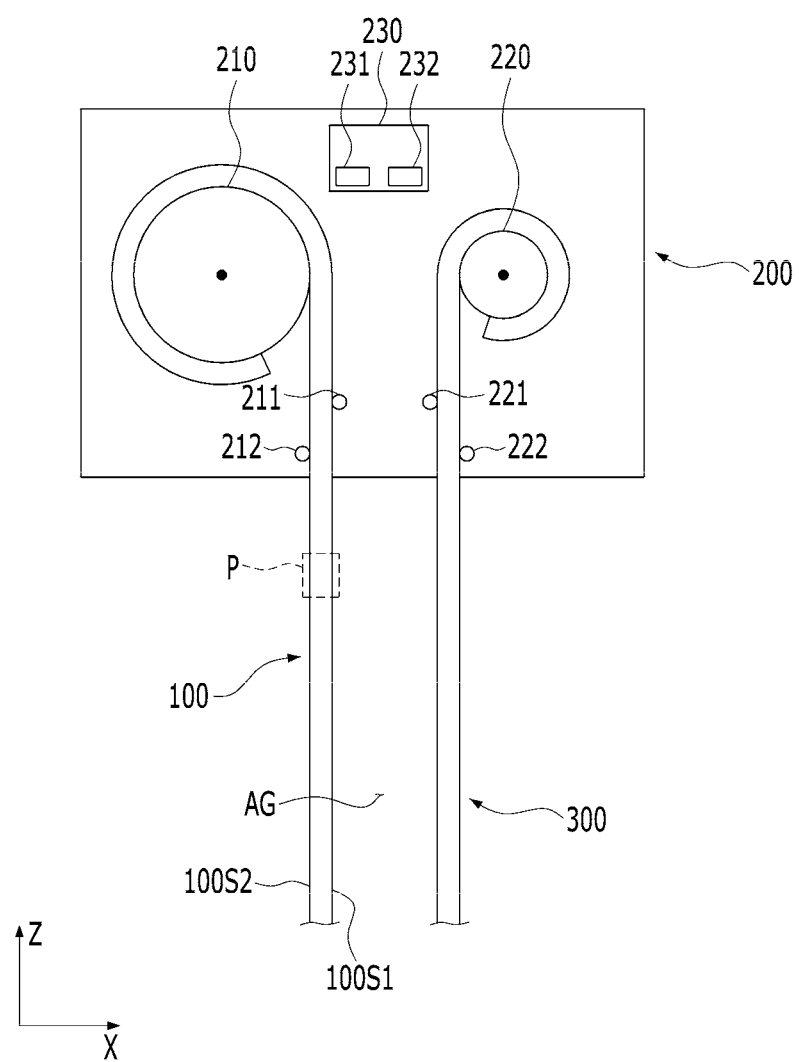
FIG. 2A is a view showing a cross section of an upper end portion of the rollable display device according to the embodiment of the present disclosure.
Figure 2B:
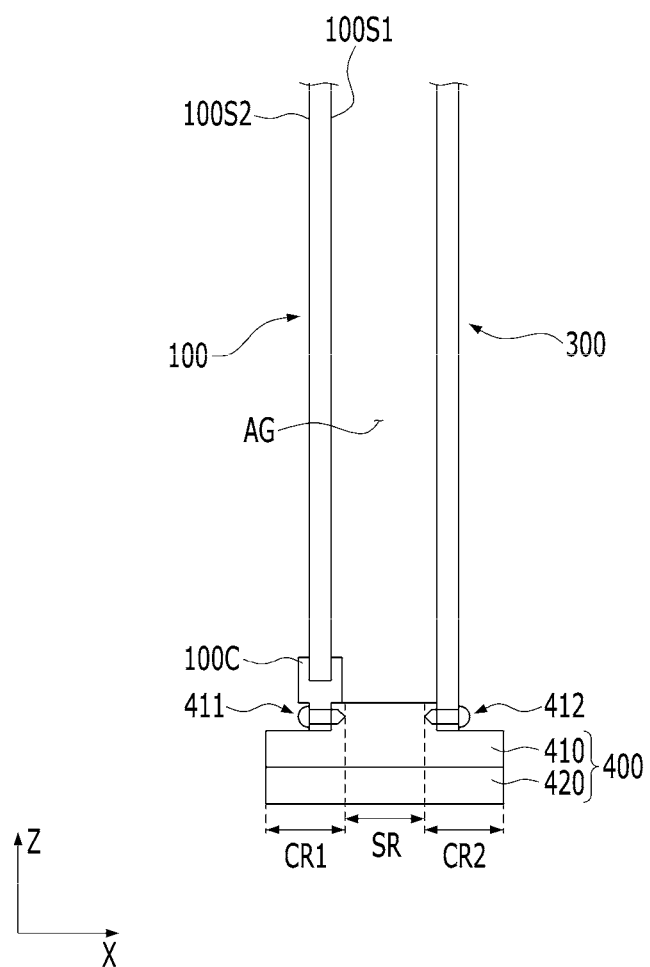
FIG. 2B is a view showing a cross section of a lower end portion of the rollable display device according to the embodiment of the present disclosure.
Figure 3:
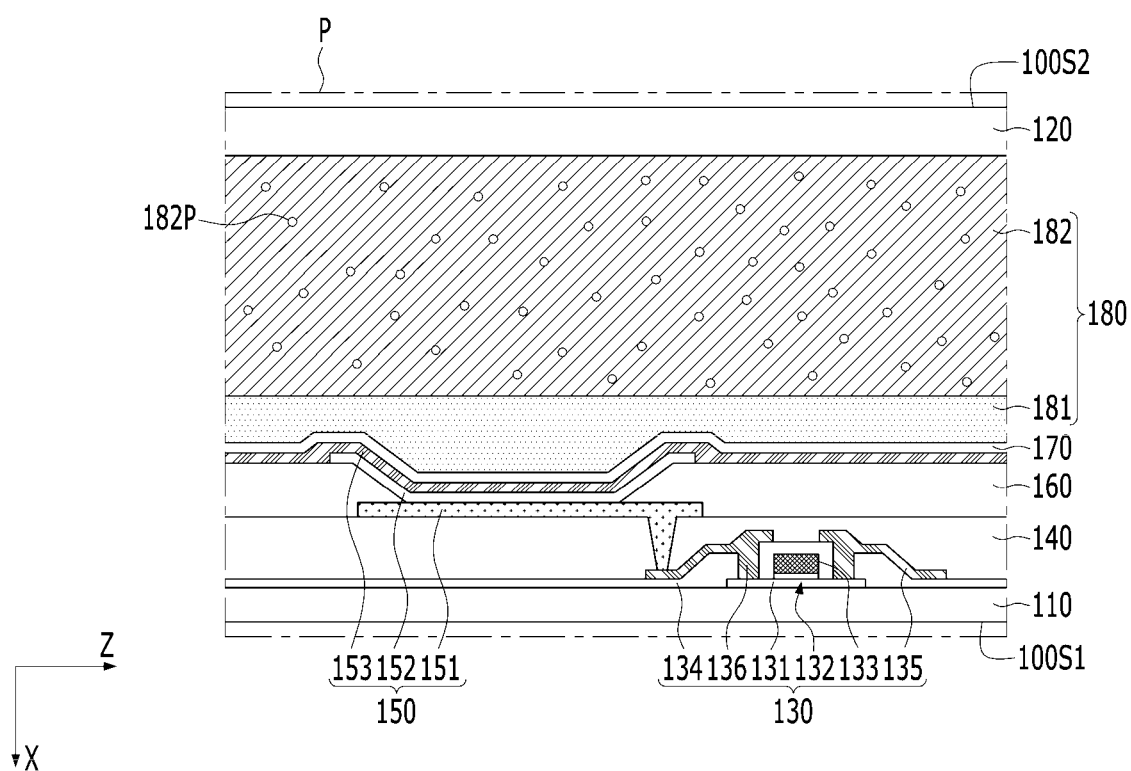
FIG. 3 is an enlarged view of region P in FIG. 2A.
Figure 4:
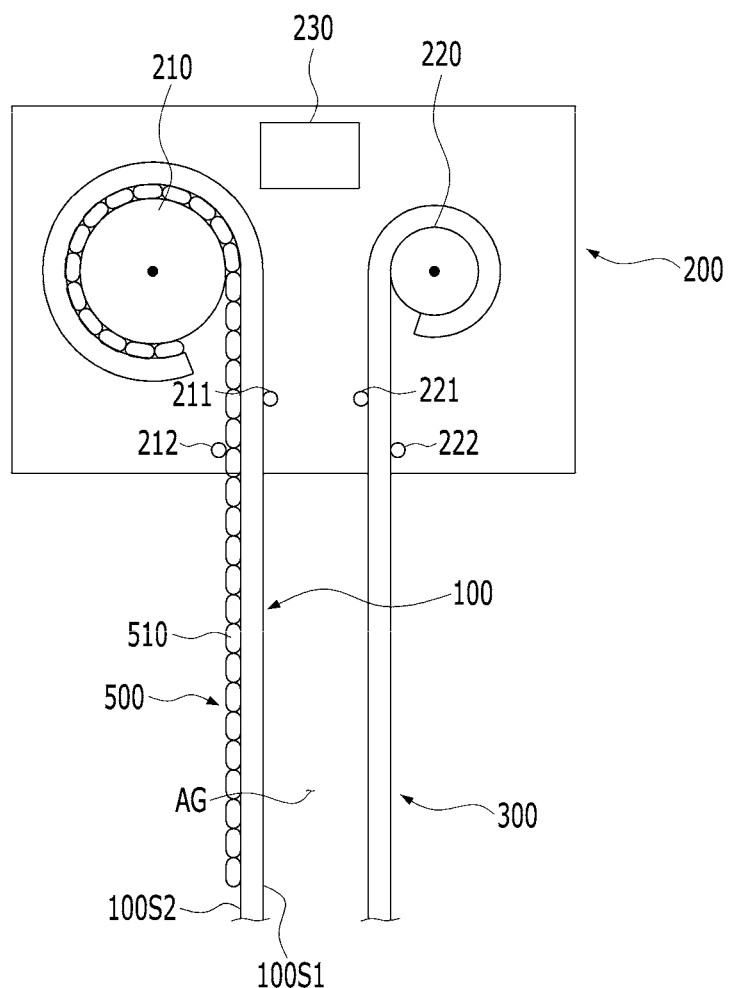
FIGS. 4 to 8 are views sequentially showing the rollable display device according to another embodiment of the present disclosure.
Figure 5:
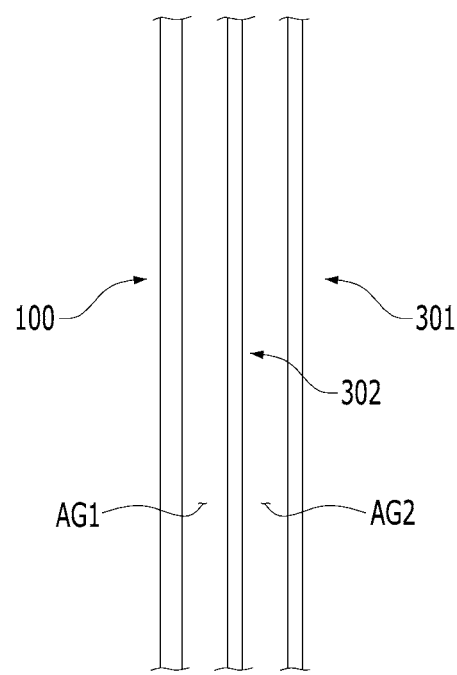

FIG. 1 is a view schematically showing a rollable display device according to an embodiment of the present disclosure. FIG. 2A is a view showing a cross section of an upper end portion of the rollable display device according to the embodiment of the present disclosure. FIG. 2B is a view showing a cross section of a lower end portion of the rollable display device according to the embodiment of the present disclosure. FIG. 3 is an enlarged view of region P in FIG. 2A.

Referring to FIGS. 1, 2A, 2B and 3, the rollable display device according to the embodiment of the present disclosure may include a flexible display panel 100, a device body 200, a transparent protection film 300 and a fixing structure 400.

The flexible display panel 100 may realize an image according to a user's request. The flexible display panel 100 may have flexibility. For example, the flexible display panel 100 may include a first flexible substrate 110 and a second flexible substrate 120, as shown in FIG. 3.

The first flexible substrate 110 may include an insulating material. The first flexible substrate 110 may include a transparent material. For example, the first flexible substrate 110 may be a thin glass substrate. An outer surface of the first flexible substrate 110 may be a display surface of the flexible display panel 100.

The second flexible substrate 120 may be coupled with the first flexible substrate 110. The second flexible substrate 120 may include a material different from the first flexible substrate 110. The second flexible substrate 120 may have a predetermined hardness. For example, the second flexible substrate 120 may include a metal such as aluminum (Al) or copper (Cu).

Elements for realizing the image may be disposed between the first flexible substrate 110 and the second flexible substrate 120. For example, a light-emitting structure 150 may be disposed between the first flexible substrate 110 and the second flexible substrate 120, as shown in FIG. 3. The flexible display panel 100 of the rollable display device according to the embodiment of the present disclosure may be an OLED panel.

The light-emitting structure 150 may generate light realizing a specific color. For example, the light-emitting structure 150 may include a first light-emitting electrode 151, a light-emitting layer 152 and s second light-emitting electrode 153, which are sequentially staked on a surface of the first flexible substrate 110 facing the second flexible substrate 120.

The first light-emitting electrode 151 may include a conductive material. The first light-emitting electrode 151 may include a transparent material. For example, the first light-emitting electrode 151 may include ITO or IZO.

The light-emitting layer 152 may generate light having a luminance corresponding to a voltage difference between the first light-emitting electrode 151 and the second light-emitting electrode 153. The light generated by the light-emitting layer 152 may realize a specific color. For example, the light-emitting layer 152 may generate light realizing one of red color, green color, blue color and white color.

The light-emitting layer 152 may include an emission material layer (EML) having an emission material. The emission material may be an organic material. The light-emitting layer 152 may have a multi-layer structure. For example, the light-emitting layer 152 may further include at least one of a hole injection layer (HIL), a hole transporting layer (HTL), an election transporting layer (ETL) and an electron injection layer (EIL).

The second light-emitting electrode 153 may include a conductive material. The second light-emitting electrode 153 may include a material different from the first light-emitting electrode 151. The reflectance of the second light-emitting electrode 153 may be higher than the reflectance of the first light-emitting electrode 151. For example, the second light-emitting electrode 153 may include a metal.

The flexible display panel 100 of the rollable display device according to the embodiment of the present disclosure may further include a thin film transistor 130 and an over-coat layer 140 which are disposed between the first flexible substrate 110 and the second flexible substrate 120.

The thin film transistor 130 may be disposed between the first flexible substrate 110 and the over-coat layer 140. For example, the thin film transistor 130 may include a semiconductor pattern 131, a gate insulating layer 132, a gate electrode 133, an interlayer insulating layer 134, a source electrode 135 and a drain electrode 136.

The semiconductor pattern 131 may be disposed close to the first flexible substrate 110. The semiconductor pattern 131 may include a semiconductor material. For example, the semiconductor pattern 131 may include amorphous silicon or poly-crystalline silicon. The semiconductor pattern 131 may include an oxide semiconductor material. For example, the semiconductor pattern 131 may include IGZO.

The semiconductor pattern 131 may include a source region, a drain region and a channel region. The channel region may be disposed between the source region and the drain region. The conductivity of the channel region may be lower than the conductivity of the source region and the conductivity of the drain region. For example, the source region and the drain region may include a conductive impurity.

The gate insulating layer 132 may be disposed on the semiconductor pattern 131. The gate insulating layer 132 may include an insulating material. For example, the gate insulating layer 132 may include silicon oxide and/or silicon nitride. The gate insulating layer 132 may include a high-K material. For example, the gate insulating layer 132 may include hafnium oxide (HfO) or titanium oxide (TiO). The gate insulating layer 132 may have a multi-layer structure.

The gate electrode 133 may be disposed on the gate insulating layer 132. The gate insulating layer 132 may insulate the gate electrode 133 from the semiconductor pattern 131. The gate electrode 133 may overlap the channel region of the semiconductor pattern 131. For example, a side surface of the gate insulating layer 132 may be vertically aligned with a side surface of the gate electrode 133. The side surface of the gate insulating layer 132 may be continuous with the side surface of the gate electrode 133. For example, the gate insulating layer 132 may overlap the channel region of the semiconductor pattern 131.

The gate electrode 133 may include a conductive material. For example, the gate electrode 133 may include a metal such as aluminum (Al), chrome (Cr), molybdenum (Mo) and tungsten (W).

The interlayer insulating layer 134 may be disposed on the semiconductor pattern 131 and the gate electrode 133. The interlayer insulating layer 134 may extend beyond the semiconductor pattern 131. For example, side surfaces of the semiconductor pattern 131 may be covered by the interlayer insulating layer 134.

The interlayer insulating layer 134 may include an insulating material. For example, the interlayer insulating layer 134 may include silicon oxide and/or silicon nitride. The interlayer insulating layer 134 may have a multi-layer structure.

The source electrode 135 may be disposed on the interlayer insulating layer 134. For example, the source electrode 135 may overlap the source region of the semiconductor pattern 131. The source electrode 135 may be electrically connected to the source region of the semiconductor pattern 131. For example, the interlayer insulating layer 134 may include a contact hole partially exposing the source region of the semiconductor pattern 131.

The source electrode 135 may include a conductive material. For example, the source electrode 135 may include a metal such as aluminum (Al), chrome (Cr), molybdenum (Mo) and tungsten (W). The source electrode 135 may include a material different from the gate electrode 133.

The drain electrode 136 may be disposed on the interlayer insulating layer 134. The drain electrode 136 may be spaced away from the source electrode 135. For example, the drain electrode 136 may overlap the drain region of the semiconductor pattern 131. The drain electrode 136 may be electrically connected to the drain region of the semiconductor pattern 131. For example, the interlayer insulating layer 134 may include a contact hole partially exposing the drain region of the semiconductor pattern 131.

The drain electrode 136 may include a conductive material. For example, the drain electrode 136 may include a metal such as aluminum (Al), chrome (Cr), molybdenum (Mo) and tungsten (W). The drain electrode 136 may include a material different from the gate electrode 133. For example, the drain electrode 136 may include a material the same as the source electrode 135.

The over-coat layer 140 may be disposed between the thin film transistor 130 and the light-emitting structure 150. The over-coat layer 140 may remove a thickness difference due to the thin film transistor 130. For example, a surface of the over-coat layer 140 facing the light-emitting structure 150 may be a flat surface.

The light-emitting structure 150 may be controlled by the thin film transistor 130. For example, the first light-emitting electrode 151 may be electrically connected to the drain electrode 136 of the thin film transistor 130. The over-coat layer 140 may include a contact hole partially exposing the drain electrode 136 of the thin film transistor 130.

The over-coat layer 140 may include an insulating material. The over-coat layer 140 may include a material different from the interlayer insulating layer 134. For example, the over-coat layer 140 may include an organic insulating material.

The flexible display panel 100 of the rollable display device according to the embodiment of the present disclosure may include a plurality of the light-emitting structure 150. Each of the light-emitting structures 150 may be controlled, independently. For example, the first light-emitting electrode 151 of each light-emitting structure 150 may be separated from the first light-emitting electrode 151 of adjacent light-emitting structures 150. The flexible display panel 100 of the rollable display device according to the embodiment of the present disclosure may further comprise a bank insulating layer 160 filling a space located between adjacent first light-emitting electrodes 151. For example, the bank insulating layer 160 may cover an edge of the first light-emitting electrode 151 of each light-emitting structure 150. The bank insulating layer 160 may include an insulating material. For example, the bank insulating layer 160 may include an organic insulating material. The bank insulating layer 160 may include a material different from the over-coat layer 140.

In the flexible display panel 100 of the rollable display device according to the embodiment of the present disclosure, each of the light-emitting structures 150 may realize a color different from adjacent light-emitting structures 150. For example, the light-emitting layer 152 of each light-emitting structure 150 may be separated from the light-emitting layer 152 of adjacent light-emitting structures 150. The second light-emitting electrode 153 of each light-emitting structure 150 may be connected to the second light-emitting electrode 153 of adjacent light-emitting structures 150. Side surfaces of the light-emitting layer 152 of each light-emitting structure 150 may be covered by the second light-emitting electrode 153.

The flexible display panel 100 of the rollable display device according to the embodiment of the present disclosure may further comprise an upper passivation layer 170 and an encapsulating layer 180 which are disposed between the light-emitting structure 150 and the second flexible substrate 120.

The upper passivation layer 170 may prevent the light-emitting structure 150 from external impact and external moisture. The upper passivation layer 170 may be located between the light-emitting structure 150 and the encapsulating layer 180. For example, the upper passivation layer 170 may be extended along the second light-emitting electrode 153.

The upper passivation layer 170 may include an insulating material. For example, the upper passivation layer 170 may include an organic insulating material and/or an inorganic insulating material. The upper passivation layer 170 may have a multi-layer structure.

The encapsulating layer 180 may be disposed between the upper passivation layer 170 and the second flexible substrate 120. The encapsulating layer 180 may be in direct contact with the second flexible substrate 120. The light-emitting structure 150 may be covered by the encapsulating layer 180. For example, the second flexible substrate 120 may be coupled with the first flexible substrate 110 in which the light-emitting structure is formed.

The encapsulating layer 180 may have a multi-layer structure. For example, the encapsulating layer 180 may include a first encapsulating layer 181 and a second encapsulating layer 182. The first encapsulating layer 181 may be located close to the upper passivation layer 170. The second encapsulating layer 182 may be disposed close to the second flexible substrate 120.

The first encapsulating layer 181 and the second encapsulating layer 182 may include a curable material. For example, the first encapsulating layer 181 and the second encapsulating layer 182 may include a thermosetting resin. The second encapsulating layer 182 may include a material different from the first encapsulating layer 181.

The second encapsulating layer 182 may include a moisture-absorbing material 182$p$. The moisture-absorbing material 182$p$ may absorb the moisture permeating from the outside. The first encapsulating layer 181 may relieve stress due to the expansion of the moisture-absorbing material 182$p$.

The device body 200 may provide a space for accommodating the flexible display panel 100. For example, the device body 200 may include a panel roller 210, as shown in FIG. 2A. An upper end portion of the flexible display panel 100 may be fixed to the panel roller 210. For example, the flexible display panel 100 may be wound on the panel roller 210 according to a user's request. The panel roller 210 may be rotated by a user's request. For example, the flexible display panel 100 may be wound along the outer surface of the panel roller 210.

The device body 200 may further include a first panel guide roller 211 and a second panel guide roller 212. The first panel guide roller 211 and the second panel guide roller 212 may prevent damage from the flexible display panel 100 during being wound or unfolded on the panel roller 210. For example, the first panel guide roller 211 may be disposed on a display surface 100S1 of the flexible display panel 100. The second panel guide roller 212 may be located on a non-display surface 100S2 of the flexible display panel 100 opposite to the display surface 100S1. The non-display surface 100S2 of the flexible display panel 100 may be an outer surface of the second flexible substrate 120. The location of the second panel guide roller 212 may be different from the location of the first panel guide roller 211. For example, when the flexible display panel 100 is wound on the panel roller 210, the time point at which the flexible display panel 100 contacts the first panel guide roller 211 may be different from the time point at which the flexible display panel 100 contacts the second panel guide roller 212.

The transparent protection film 300 may be disposed on the display surface 100S1 of the flexible display panel 100. The transparent protection film 300 may be spaced away from the flexible display panel 100. For example, an air gap AG may be disposed between the flexible display panel 100 and the transparent protection film 300.

The transparent protection film 300 may include a material having high transmittance. The transparent protection film 300 may have a predetermined hardness. For example, the transparent protection film 300 may include one of polyethylene terephthalate (PET), poly-methyl methacrylate (PMMA), Glassil and oleophobic.

The rollable display device according to the embodiment of the present disclosure may include the transparent protection film 300 located on the display surface 100S1 of the flexible display panel 100, wherein the transparent protection film 300 is spaced away from the flexible display panel 100. Thus, in the rollable display device according to the embodiment of the present disclosure, the transparent protection film 300 may be bent by the external impact applied in a direction of the display surface 100S1 of the flexible display panel 100. That is, in the rollable display device according to the embodiment of the present disclosure, the external impact applied in the direction of the display surface 100S1 of the flexible display panel 100 may be absorbed and/or dispersed by the transparent protection film 300. Therefore, in the rollable display device according to the embodiment of the present disclosure, the external impact applied to the flexible display panel 100 may be reduced by the transparent protection film 300.

An upper end portion of the transparent protection film 300 may be fixed to the device body 200. For example, the device body 200 may further include a TPS roller 220 coupled with the upper end portion of the transparent protection film 300. The transparent protection film 300 may be wound on the TPS roller 220 according to a user's request. For example, the transparent protection film 300 may be accommodated in the device body 200.

The transparent protection film 300 may move with the flexible display panel 100, simultaneously. For example, the device body 200 may further comprise a roller driving unit 230 driving the panel roller 210 and the TPS roller 220. The roller driving unit 230 may rotate the panel roller 210 and the TPS roller 220, simultaneously. A size of the TPS roller 220 may be different from a size of the panel roller 210. For example, the TPS roller 220 may be smaller than the panel roller 210. A rotation speed of the TPS roller 220 may be different from a rotation speed of the panel roller 210. For example, the roller driving unit 230 may include a panel roller controller 231 controlling the panel roller 210, and a TPS roller controller 232 controlling the TPS roller 220.

The rollable display device according to the embodiment of the present disclosure may prevent damage from the transparent protection film 300 during the transparent protection film 300 being wound or unfolded on the TPS roller 220. For example, the device body 200 of the rollable display device according to the embodiment of the present disclosure may further comprise a first TPS guide roller 221 and a second TPS guide roller 222. A location of the second TPS guide roller 222 may be different from a location of the first TPS guide roller 221.

A direction of winding the transparent protection film 300 on the TPS roller 220 may be opposite to a direction of winding the flexible display panel 100 on the panel roller 210. For example, the flexible display panel 100 may be wound so that the non-display surface 100S2 of the flexible display panel 100 opposite to the display surface 100S1 faces the panel roller 210. Thus, in the rollable display device according to the embodiment of the present disclosure, the width of the air gap AG located between unfolded flexible display panel 100 and unfolded transparent protection film 300 may be efficiently adjusted.

The fixing structure 400 may fix a lower end portion of the flexible display panel 100 and a lower end portion of the transparent protection film 300. For example, when the flexible display panel 100 and the transparent protection film 300 are unfolded, the width of the air gap AG may be maintained by the fixing structure 400. The fixing structure 400 may include a coupling part 410 and a weight part 420, as shown in FIG. 2B.

The coupling part 410 may include a first coupling region CR1, a second coupling region CR2 and a separating region SR. The lower end portion of the flexible display panel 100 may be fixed to the first coupling region CR1 of the coupling part 410 by a first coupling element 411. For example, the rollable display device according to the embodiment of the present disclosure may further include a panel mounting bracket 100c surrounding the lower end portion of the flexible display panel 100. The panel mounting bracket 100c may be coupled with the first coupling region CR1 of the coupling part 410 by the first coupling element 411. The lower end portion of the transparent protection film 300 may be fixed to the second coupling region CR2 of the coupling part 410 by a second coupling element 412. The separating region SR may be disposed between the first coupling region CR1 and the second coupling region CR2.

The rollable display device according to the embodiment of the present disclosure is described such that the lower end portion of the transparent protection film 300 is fixed to the fixing structure 400. However, the rollable display device according to another embodiment of the present disclosure may further comprise a TPS mounting bracket for fixing the transparent protection film 300 to the fixing structure 400. For example, in the rollable display device according to another embodiment of the present disclosure, the lower end portion of the transparent protection film 300 may be surrounded by the TPS mounting bracket which is coupled with the fixing structure 400.

The weight part 420 may be disposed under the coupling part 410. For example, a horizontal length of the weight part 420 may be the same as a horizontal length of the coupling part 410. A side surface of the weight part 420 may be continuous with a side surface of the coupling part 410.

The weight part 420 may be heavier than the coupling part 410. For example, the weight part 420 may include a metal. Thus, in the rollable display device according to the embodiment of the present disclosure, the air gap AG may be maintained during unfolding the flexible display panel 100 and the transparent protection film 300. Therefore, in the rollable display device according to the embodiment of the present disclosure, the external impact applied during unfolding of the flexible display panel 100 or winding the flexible display panel 100 on the panel roller 210 may be efficiently reduced by the transparent protection film 300.

The rollable display device according to the embodiment of the present disclosure is described such that the non-display surface 100S2 of the flexible display panel 100 may be exposed to the outside. However, in the rollable display device according to another embodiment of the present disclosure, the outer surface of the second flexible substrate 120 of the flexible display panel 100 may be covered. For example, the rollable display device according to another embodiment of the present disclosure may further include a supporting element 500 disposed on the non-display surface 100S2 of the flexible display panel 100.

The hardness of the flexible display panel 100 may be improved by the supporting element 500. The supporting element 500 may reduce the external impact applied in a direction of the non-display surface 100S2 of the flexible display panel 100. For example, the supporting element 500 may have a hardness higher than the first flexible substrate 110 and the second flexible substrate 120 of the flexible display panel 100.

When the flexible display panel 100 is wound on the panel roller 210 of the device body 200, the supporting element 500 may be accommodated in the device body 200. For example, an upper end portion of the supporting element 500 may be fixed to the panel roller 210 of the device body 200. The supporting element 500 may be wound along the outer surface of the panel roller 210 with the flexible display panel 100. For example, the supporting element 500 may include the plurality of support-bars 510 located side by side in a direction of winding of the flexible display panel 100. The plurality of support-bars 510 may be in direct contact with the flexible display panel 100. Thus, in the rollable display device according to the embodiment of the present disclosure, warpage and damage of the flexible display panel 100 due to the external impact may be effectively reduced.

The rollable display device according to the embodiment of the present disclosure is described such that the transparent protection film 300 on the display surface 100S1 of the flexible display panel 100 is only single. However, the rollable display device according to another embodiment of the present disclosure may include the plurality of transparent protection film 300. For example, the rollable display device according to another embodiment of the present disclosure may include a first transparent protection film 301 disposed on the display surface 100S1 of the flexible display panel 100, and a second transparent protection film 302 disposed between the flexible display panel 100 and the first transparent protection film 301. The second transparent protection film 302 may include a material the same as the first transparent protection film 301. For example, the thickness of the second transparent protection film 302 may be equal to the thickness of the first transparent protection film 301.

The second transparent protection film 302 may be spaced away from the flexible display panel 100 and the first transparent protection film 301. Thus, in the rollable display device according to another embodiment of the present disclosure, two air gaps AG1 and AG2 may be disposed on the display surface 100S1 of the flexible display panel 100. That is, in the rollable display device according to another embodiment of the present disclosure, the external impact applied to the display surface 100S1 of the flexible display panel 100 may be primarily absorbed and/or dispersed by the first transparent protection film 301, and may be secondarily absorbed and/or dispersed by the second transparent protection film 302. Thereby, in the rollable display device according to another embodiment of the present disclosure, the decrease of the transmittance by the transparent protection films 301 and 302 may be minimized, and warpage and damage of the flexible display panel 100 due to an external impact may be minimized.

The rollable display device according to the embodiment of the present disclosure is described such that it is a roll-down type in which the flexible display panel 100 wound on the panel roller 210 descends according to a user's request. However, in the rollable display device according to another embodiment of the present disclosure, the flexible display panel 100 may be unfolded in various directions. For example, the rollable display device according to another embodiment of the present disclosure may be a roll-up type in which the flexible display panel 100 accommodated in the device body 200 may be moved in the upward direction of the device body 200 according to a user's request.

Figure 6:
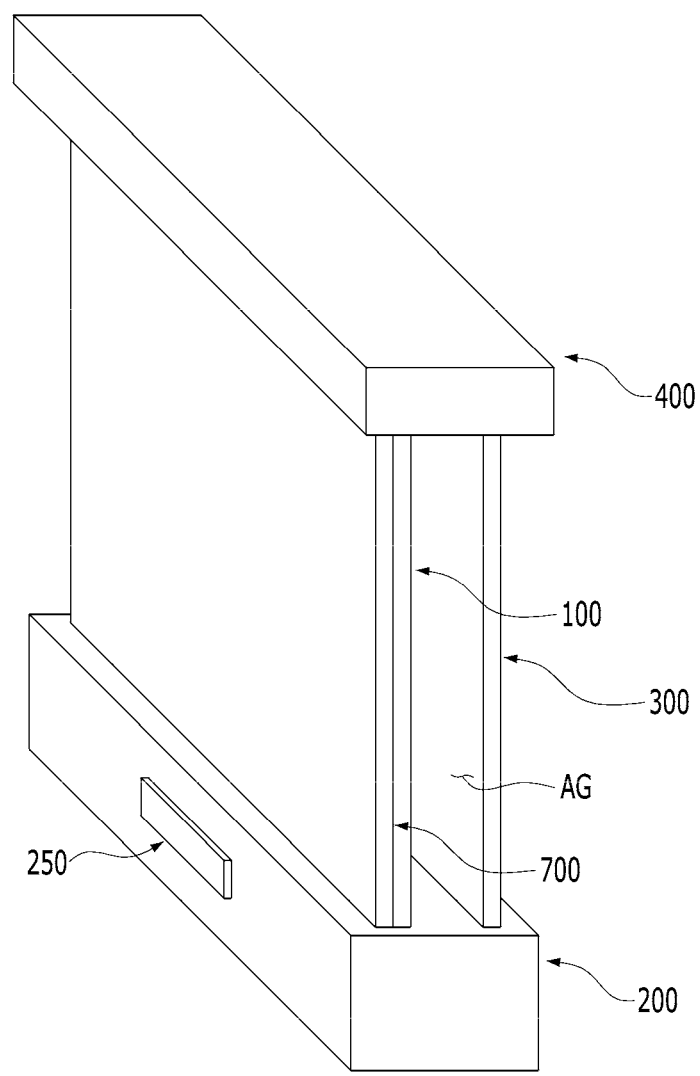
Figure 7:
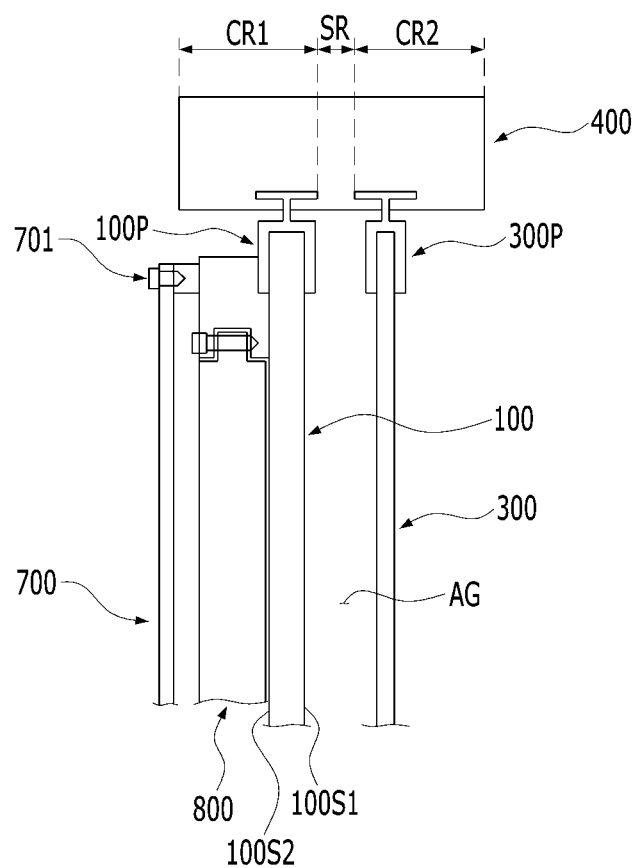
Figure 8:
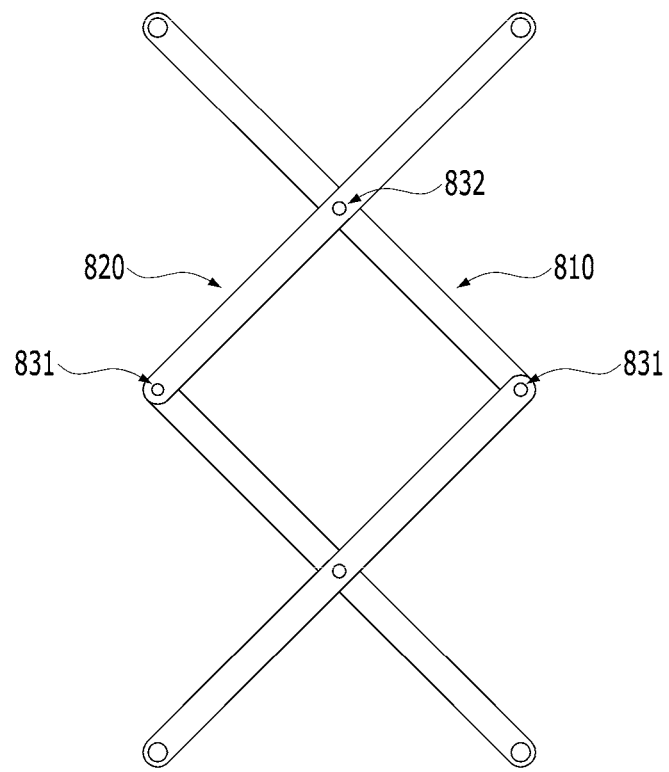

The rollable display device according to another embodiment of the present disclosure may include the fixing structure 400 disposed above the device body 200, as shown in FIGS. 6 to 8. The lower end portion of the flexible display panel 100 and the lower end portion of the transparent protection film 300 may be fixed to the device body 200. The upper end portion of the flexible display panel 100 may be fixed to the first coupling region CR1 of the fixing structure 400. For example, the rollable display device according to another embodiment of the present disclosure may further comprise a first upper mounting bracket 100p surrounding the upper end portion of the flexible display panel 100. The first upper mounting bracket 100p may be physically coupled with the first coupling region CR1 of the fixing structure 400. The upper end portion of the transparent protection film 300 may be fixed to the second coupling region CR2 of the fixing structure 400. For example, the rollable display device according to another embodiment of the present disclosure may further include a second upper mounting bracket 300p surrounding the upper end portion of the transparent protection film 300. The second upper mounting bracket 300p may be physically coupled with the second coupling region CR2 of the fixing structure 400.

The rollable display device according to another embodiment of the present disclosure may further comprise a link structure 800 for moving the fixing structure according to a user's request. The link structure 800 may be disposed on the non-display surface 100S2 of the flexible display panel 100. For example, the non-display surface 100S2 of the flexible display panel 100 in which the link structure 800 is located may be opposite to the display surface 100S1 of the flexible display panel 100. The flexible display panel 100 may be disposed between the transparent protection film 300 and the link structure 800. The device body 200 may further include a link driving unit 250 for driving the link structure 800, as shown in FIG. 6.

A lower end portion of the link structure 800 may be fixed to the device body 200. An upper end portion of the link structure 800 may be fixed to the fixing structure 400. For example, the upper end portion of the link structure 800 may be coupling with the first upper mounting bracket 100p, as shown in FIG. 7. Thus, in the rollable display device according to another embodiment of the present disclosure, the movement of the flexible display panel 100 during unfolding operation may be minimized.

The link structure 800 may include a plurality of right links 810 and a plurality of left links 820. End portion of each right link 810 may be coupled with end portion of corresponding left link 820 by a first link coupling element 831. Each of the right links 810 may cross one of the left links 820. The central region of the right link 810 and the central region of left link 820 that intersect with each other may be coupled by a second link coupling element 832. For example, the link structure 800 may be a shape in which the right link 810 and the left link 820 intersecting in an X shape are repeated, as shown in FIG. 8.

The rollable display device according to another embodiment of the present disclosure may further include a back cover 700 covering the link structure 800. An upper end portion of the back cover 700 may be fixed to the upper end portion of the link structure 800. For example, the rollable display device according to another embodiment of the present disclosure may further comprise a cover coupling element 710 coupling the upper end portion of the back cover 700 to the upper end portion of the link structure 800, as shown in FIG. 7.

The back cover 700 may include a flexible material. For example, the device body 200 may provide a space for accommodating the back cover 700. The back cover 700 may be accommodated or unfolded with the flexible display panel 100 and the transparent protection film 300, simultaneously. For example, a cover roller that is fixed may be disposed in the device body 200. A lower end portion of the back cover 700 may be fixed to the cover roller.

Accordingly, in the rollable display device according to the embodiment of the present disclosure, the transparent protection film 300 disposed on the display surface 100S1 of the flexible display panel 100 may be spaced away from the flexible display panel 100, and the space between the flexible display panel 100 and the transparent protection film 300 may be maintained by the fixing structure 400, such that warpage and damage of the flexible display panel 100 due to the external impact may be reduced.

In the result, the rollable display device, including a transparent protection film on a flexible display panel and an air gap between the flexible display panel and the transparent protection film according to the embodiments of the present disclosure, may reduce an external impact applied in a direction of a display surface of the flexible display panel. Thus, in the rollable display device according to the embodiments of the present disclosure, warpage and damage of the flexible display panel due to the external impact may be minimized.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A rollable display device comprising:
a flexible display panel including a display surface and a non-display surface opposite to the display surface;
a first transparent protection film adjacent to the display surface of the flexible display panel and spaced away from the flexible display panel;
an air gap between the flexible display panel and the first transparent protection film;
a device body including a first roller fixing a first end portion of the flexible display panel, and a second roller fixing a first end portion of the first transparent protection film; and
a fixing structure fixing a second end portion of the flexible display panel and a second end portion of the first transparent protection film.

2. The rollable display device according to claim 1, wherein the flexible display panel includes a first flexible substrate of thin glass and a second flexible substrate coupled with the first flexible substrate, the first flexible substrate being closer to the first transparent protection film than the second flexible substrate.

3. The rollable display device according to claim 1, wherein the fixing structure includes a coupling part and a weight part disposed under the coupling part, and
wherein the second end portion of the flexible display panel and the second end portion of the first transparent protection film is fixed to the coupling part of the fixing structure.

4. The rollable display device according to claim 3, wherein the weight part is heavier than the coupling part.

5. The rollable display device according to claim 1, further comprising a supporting element disposed on the non-display surface of the flexible display panel.

6. The rollable display device according to claim 5, the supporting element is in contact with the flexible display panel.

7. The rollable display device according to claim 5, an end portion of the supporting element is fixed to the first roller of the device body.

8. The rollable display device according to claim 1, wherein the first transparent protection film includes one or more of polyethylene terephthalate (PET), poly-methyl methacrylate (PMMA), Glassil and oleophobic.

9. The rollable display device according to claim 1, further comprising a second transparent protection film disposed between the flexible display panel and the first transparent protection film, wherein the second transparent protection film is spaced away from the flexible display panel and the first transparent protection film.

10. The rollable display device according to claim 9, wherein the second transparent protection film includes a material the same as the first transparent protection film.

11. The rollable display device according to claim 1, wherein the air gap directly contacts the display surface of the flexible display panel.

12. A rollable display device comprising:
a device body including a first roller and a second roller spaced away from the first roller;
a fixing structure, the fixing structure including a first coupling region, a second coupling region and a separating region disposed between the first coupling region and the second coupling region;
a flexible display panel including a first end portion fixed to the first roller of the device body, and a second end portion fixed to the first coupling region of the fixing structure and including a display surface;
a transparent protection film including a first end portion fixed to the second roller of the device body, and a second end portion fixed to the second coupling region of the fixing structure, the transparent protection film being disposed adjacent to a display surface of the flexible display panel; and
an air gap between the display surface of the flexible display panel and the transparent protection film.

13. The rollable display device according to claim 12, wherein the flexible display panel is wound on the first roller of the device body, and the transparent protection film is wound on the second roller of the device body, and
wherein a direction of winding the transparent protection film is opposite to a direction of winding the flexible display panel.

14. The rollable display device according to claim 13, wherein a thickness of the air gap is based on a distance between the first roller and the second roller.

15. The rollable display device according to claim 12, further comprising a link structure disposed on a non-display surface of the flexible display panel,
wherein the link structure includes a first end portion fixed to the device body, and a second end portion fixed to the fixing structure.

16. The rollable display device according to claim 15, wherein the flexible display panel is disposed between the transparent protection film and the link structure.

17. The rollable display device according to claim 15, further comprising a mounting bracket surrounding the second end portion of the flexible display panel, the mounting bracket fixed to the fixing structure,
wherein the second end portion of the link structure is coupled with the mounting bracket.

18. The rollable display device according to claim 15, further comprising a back cover disposed outside the link structure,
wherein the back cover includes an end portion coupled with the second end portion of the link structure.

19. The rollable display device according to claim 12, wherein the air gap directly contacts the display surface of the flexible display panel and a surface of the transparent protection film.

* * * * *